United States Patent [19]

Teene

[11] Patent Number: 5,726,997
[45] Date of Patent: Mar. 10, 1998

US005726997A

[54] APPARATUS AND METHOD FOR TESTING OF INTEGRATED CIRCUITS

[76] Inventor: Andres R. Teene, 813 E. Ridgecrest Rd., Fort Collins, Colo. 80524

[21] Appl. No.: 445,970

[22] Filed: May 22, 1995

Related U.S. Application Data

[63] Continuation of Ser. No. 134,788, Oct. 12, 1993, abandoned.

[51] Int. Cl.$^6$ .......................... G01R 31/00; G01R 31/28
[52] U.S. Cl. .................. 371/22.3; 364/483; 324/537; 324/765
[58] Field of Search ........................... 371/22.1, 22.2, 371/22.3, 22.4, 22.5, 22.6; 324/73.1, 158.1, 537, 765; 361/18, 100, 101

[56] References Cited

U.S. PATENT DOCUMENTS

| | | | |
|---|---|---|---|
| 4,347,540 | 8/1982 | Gary et al. | 361/47 |
| 4,581,672 | 4/1986 | Lucero | 361/18 |
| 4,597,080 | 6/1986 | Thatte et al. | 371/25 |
| 4,625,162 | 11/1986 | Bosnyak | 371/22.2 |
| 4,642,784 | 2/1987 | White, Jr. et al. | 364/551 |
| 4,720,758 | 1/1988 | Winslow | 361/18 |
| 4,739,250 | 4/1988 | Tanizawa | 324/73 R |
| 4,749,947 | 6/1988 | Gheewala | 324/73 R |
| 4,937,826 | 6/1990 | Gheewala et al. | 371/22.1 |
| 4,942,556 | 7/1990 | Sasaki et al. | 365/200 |
| 5,025,344 | 6/1991 | Maly et al. | 361/88 |
| 5,057,774 | 10/1991 | Verhelst et al. | 324/537 |
| 5,068,603 | 11/1991 | Mahoney | 324/158 R |
| 5,068,604 | 11/1991 | Van de Lagemaat | 324/537 |
| 5,097,206 | 3/1992 | Perner | 324/158 R |
| 5,115,191 | 5/1992 | Yoshimori | 324/158 |
| 5,159,516 | 10/1992 | Fujihira | 361/18 |
| 5,233,287 | 8/1993 | Lenk | 361/18 |
| 5,241,266 | 8/1993 | Ahmad et al. | 324/158 R |
| 5,260,946 | 11/1993 | Nunally | 371/22.1 |
| 5,271,019 | 12/1993 | Edwards et al. | 371/22.3 |
| 5,299,202 | 3/1994 | Vaillancourt | 371/11.1 |
| 5,332,973 | 7/1994 | Brown et al. | 324/537 |
| 5,343,350 | 8/1994 | Pohl et al. | 361/18 |
| 5,371,457 | 12/1994 | Lipp | 324/158.1 |
| 5,392,293 | 2/1995 | Hsue | 324/158.1 |
| 5,459,737 | 10/1995 | Andrews | 371/22.3 |
| 5,483,170 | 1/1996 | Beasley et al. | 324/537 |
| 5,491,665 | 2/1996 | Sachdev | 365/201 |
| 5,495,448 | 2/1996 | Sachdev | 365/201 |
| 5,554,941 | 9/1996 | Kesel | 324/765 |
| 5,570,034 | 10/1996 | Needham et al. | 324/765 |

OTHER PUBLICATIONS

Maly et al., "Built-In Current Testing—Feasibility Study", IEEE 1988 International Conference on Computer-Aided Design, pp. 340-343.

Maly et al., "Circuit Design for Built-In Current Testing", IEEE 1991 Custom Integrated Circuits Conference, pp. 13.4.1 -13.4.5.

Maly et al., "Built-In Current Testing", IEEE Journal of Solid-State Circuits, vol. 27, No. 3, Mar. 1992, pp. 425-428.

Shen et al., "On-Chip Current Sensing Circuit for CMOS VLSI", Test Symposium 1992, Paper 16.2, pp. 309-314.

Journal of Electronic Testing; Design of ICs Applying Built-In Current Testing; pp. 111-120; Wojciech Maly and Marek Patyra.

*Primary Examiner*—Emanuel T. Voeltz
*Assistant Examiner*—Eric W. Stamber

[57] ABSTRACT

Current monitoring cells are located at selected locations on power supply lines within a chip. Each cell compares the current flow at predetermined times with a reference. If the current exceeds the reference, a signal is provided indicating a fault in the chip. A flip flop in the cell is set to maintain an indication of the fault condition. In two embodiments, the cells are connected with a scan chain which is used to sequentially access the test results for each cell. A third embodiment does not include the scan chain. A current divider may be included in each cell to isolate the voltage drop of the fault sensor from the functional circuit to minimize the impact of measuring the current for fault detection purposes.

33 Claims, 4 Drawing Sheets

APPARATUS AND METHOD FOR TESTING OF INTEGRATED CIRCUITS

This is a continuation of application Ser. No. 08/134,788, filed Oct. 12, 1993 abandoned.

BACKGROUND OF THE INVENTION

The present invention relates generally to an apparatus and method for testing of integrated circuits, and more particularly relates to such an apparatus and method in which test circuitry is embedded directly into the integrated circuit to be tested and enables continuous operation of the circuit while testing is being carried on.

The development of manufacturing test programs for CMOS (complementary metal-oxide-semiconductor) integrated circuits is a time-consuming and costly development activity. As the design complexity of CMOS integrated circuits increases, manufacturing test development is becoming a major portion of the design cycle. At present, the majority of techniques for test program development are based upon the use of "stuck-at-fault" arrangements. The "stuck-at-fault" model is the basis for fault simulation, ATPG (automatic test pattern generation), scan testing, BIST (built-in self test technique) and some embedded test structures. The "stuck-at-fault" model has been shown to be inadequate in identifying the majority of possible manufacturing defects.

Iddq (static or quiescent power supply current) testing has been proposed as a more accurate method of detecting manufacturing faults for static CMOS circuits. The iddq test is based upon monitoring the quiescent idd current. Variations in the quiescent Idd current can indicate a fault circuit.

SUMMARY OF THE INVENTION

The present invention is directed to an apparatus and method for providing internal Iddq current testing capability for standard cell and gate array integrated circuits by embedding iddq test circuitry directly into the array of cells. The Iddq current is monitored and tested at various points within an array of cells, and can be implemented for standard cell, gate array and sea of gates CMOS integrated circuits. This permits the manufacturing test to be accomplished by the chip itself without the need for expensive test equipment or the generation of additional test patterns. The Iddq test can be used with functional patterns. This will also support JTAG standards (JTAG 1149.1 is an IEEE standard for boundary scan) and allow for in-circuit testing of the integrated circuit. The embedded built-in Iddq test circuitry can also be used for real time monitoring of current, current flow analysis and identification of faults.

The present invention thus provides for internal monitoring of current in a chip without expensive test equipment or time-consuming generation of test patterns. The current monitoring cells can also be used in conjunction with test patterns to provide real time monitoring of current for identification of faults.

It is accordingly an object of the present invention to provide an apparatus and method for embedded built-in static current testing for integrated circuits.

It is another object of the present invention to provide such an apparatus and method for embedded built-in static current testing which enables continuing operation of the integrated circuit being tested while the testing is being carried on.

It is another object of the invention to provide an apparatus and method for monitoring current in a chip without expensive test equipment or time consuming generation of test patterns.

It is another object of the present invention to provide an apparatus for static current testing which employs a plurality of current monitor cells which are connected with a scan chain for reading out the results of the test.

Additional benefits and advantages of the present invention will become apparent to those skilled in the art to which this invention relates from the subsequent description of the preferred embodiments and the appended claims, taken in conjunction with the accompanying drawings.

DETAILED DESCRIPTION

Figure 1:
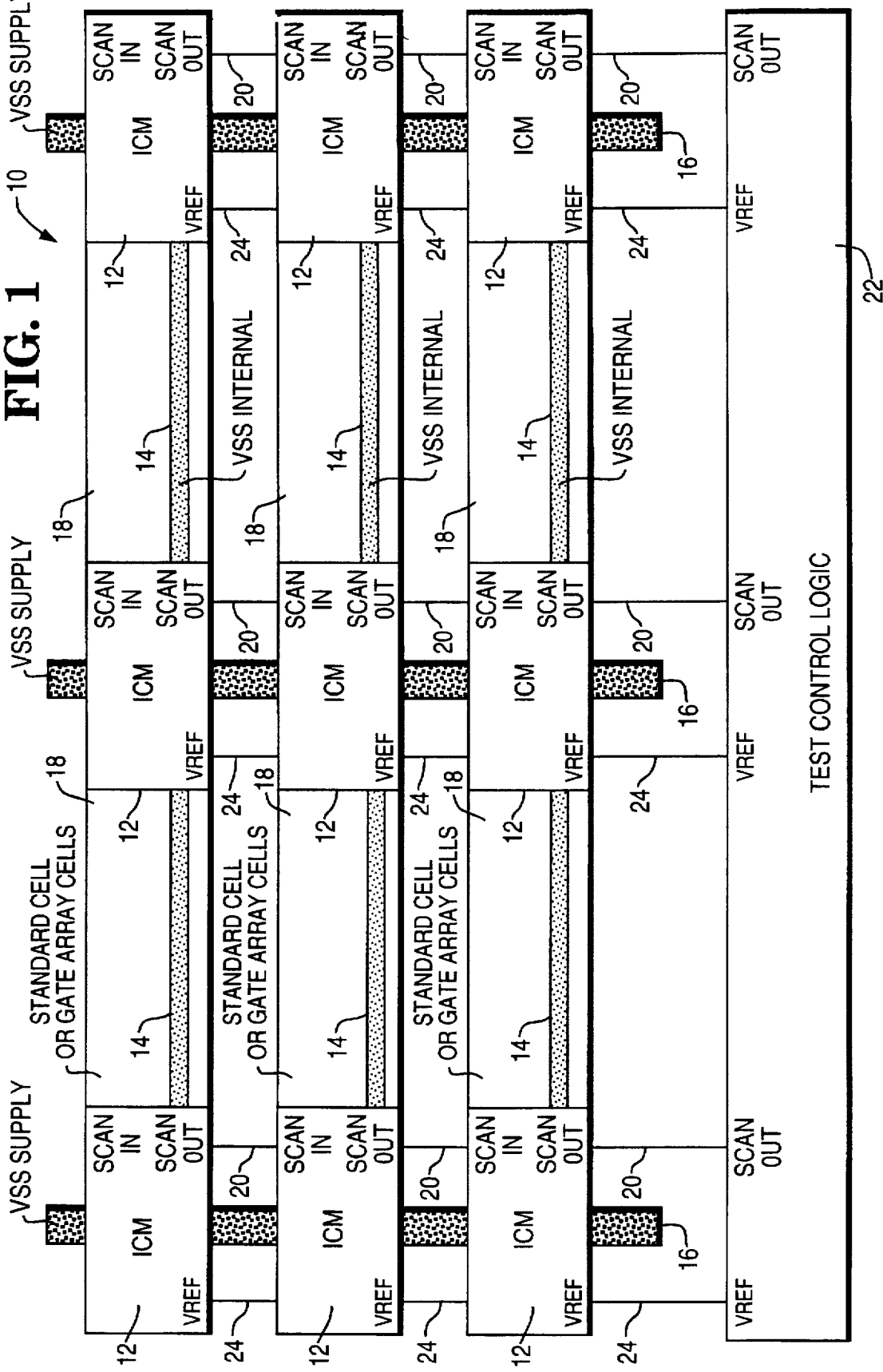
FIG. 1 is a schematic view of an integrated circuit which includes an embedded built-in Iddq test capability.

Referring now to FIG. 1, shown there is an integrated circuit 10 having a built-in Iddq test circuit. The test circuit comprises a plurality of Iddq current monitoring cells 12 which are used for both power distribution and current sensing. The cells 12 are arranged in the illustrated embodiment in vertical columns and horizontal rows, with internal power busses 14 distributing power to these cells. Power is distributed to the internal power busses 14 by supply busses 16 which run perpendicular to the internal power busses 14 in the illustrated embodiment. Standard or gate array cells 18 for performing the particular functions for which the circuit 10 is designed are positioned between the current monitoring cells 12, and power is provided to these cells 18 by the internal power busses 14.

It will be seen that an Iddq current monitor cell 12 can be used at all, or selective, grid connection points between the supply busses 16 and the internal busses 14 for both power distribution and iddq current monitoring. Each of the Iddq current monitor cells 12 can test the Iddq current at a desired point in the array. The Iddq current monitor cells 12 are connected with a scan chain 20 which is used to access sequentially the Iddq current test results for each cell 12. The Scan Out connection of one cell 12 is connected to the Scan In position of an adjacent cell 12, and so on. The Scan Out connections terminate in test control logic 22, where the results of the test are received and analyzed. Reference voltages are provided by the test control logic 22 and are applied to the various cells 12 over conductive paths 24.

Figure 2:
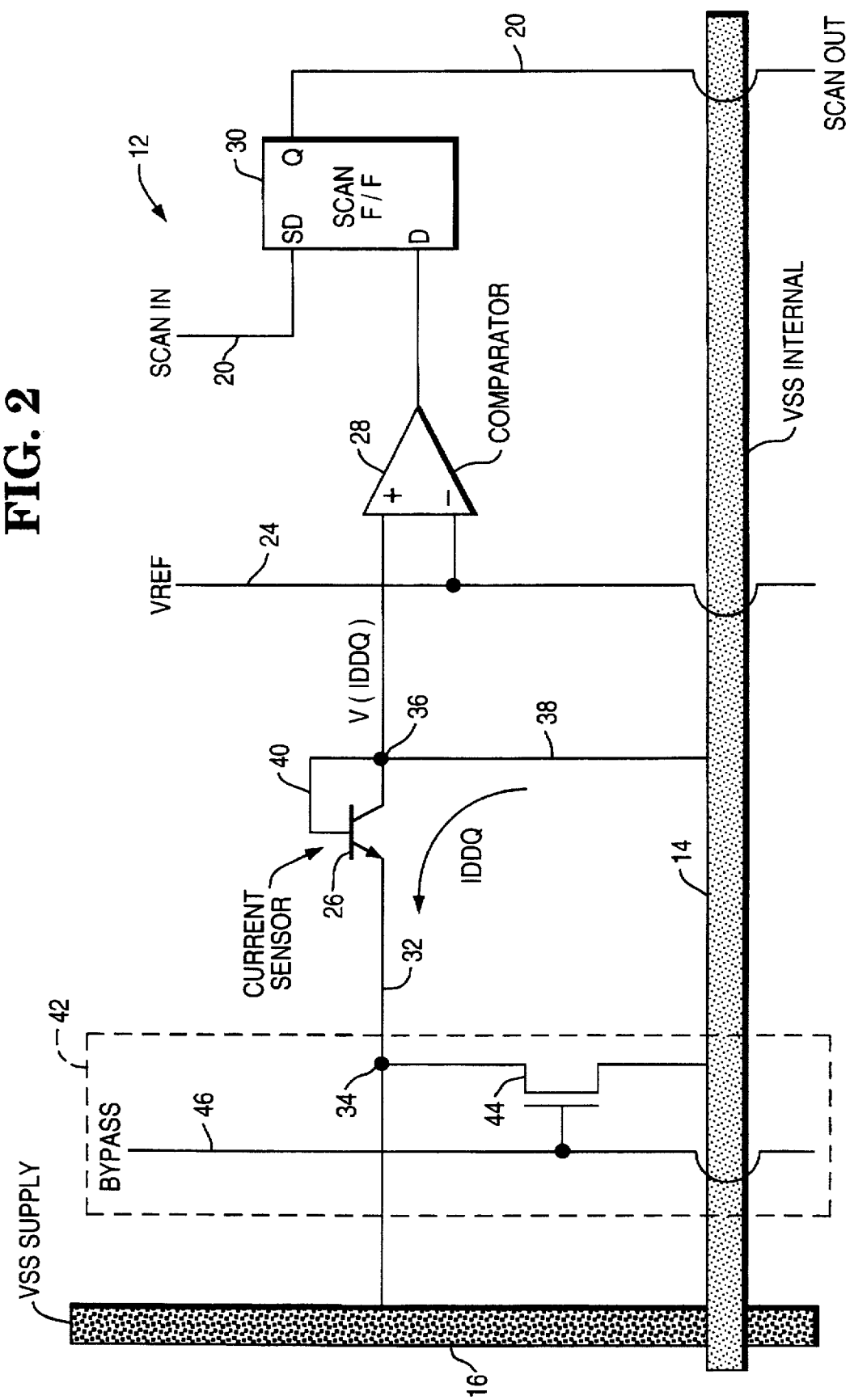
FIG. 2 is a circuit diagram of an Iddq current monitor cell.

Each Iddq current monitor cell 12 is part of the power grid distribution which is used to monitor the quiescent Idd current at various connection points in the power grid of the integrated circuit 10. Each cell 12 both distributes the power and monitors the current. The cell 12 as shown in FIG. 2 includes three main components: a current sensor 26 which converts the iddq current to a voltage drop V(Iddq) which is a function of the current; a comparator 28 which compares the voltage drop to a reference voltage; and a scan flip flop 30 which is used to scan and latch out the result. The current sensor 26 comprises a transistor having its emitter coupled via a conductor 32 and a node 34 to the VSS supply 16, having its collector coupled via a node 36 and a conductor 38 to the internal power bus 14, and having its base coupled via a conductor 40 to the node 36. Said transistor 26 can optionally be switched out of the circuit during normal operation in order to avoid the possible performance impact of the voltage drop in the current sensor by operating a bypass circuit 42 comprising an MOS transistor 44 which is connected between the node 34 and the internal power bus 14, and can be caused to conduct by applying a signal to the gate of said transistor over a bypass line 46.

The voltage reference VREF in FIG. 2 is set to test for the maximum Iddq current for a non-faulty circuit. A higher current than this maximum Iddq current indicates a faulty circuit. The voltage VREF can also be varied to measure different current levels which can be used to analyze the current flow within the power grid.

In normal operation, the current sensor converts the Iddq current to the V(Iddq) voltage level, which is then applied to the plus terminal of the comparator 28, to the minus terminal of which is applied the reference voltage VREF via line 24. The two voltages are compared by the comparator 28, and if the comparison indicates the presence of a fault in the circuit, a signal of appropriate level is applied to the data terminal D of the scan flip flop 30, which sets the flip flop. The state of the flip flop is subsequently ascertained by the scan chain 20, via the Scan In line coupled to the scan data terminal SD and the Scan Out line coupled to the output Q of the flip flop 30. If the flip flop 30 is in a predetermined one of its two possible states, it indicates no fault in the circuit, whereas if it is in the other state, the presence of a fault is indicated.

Figure 3:
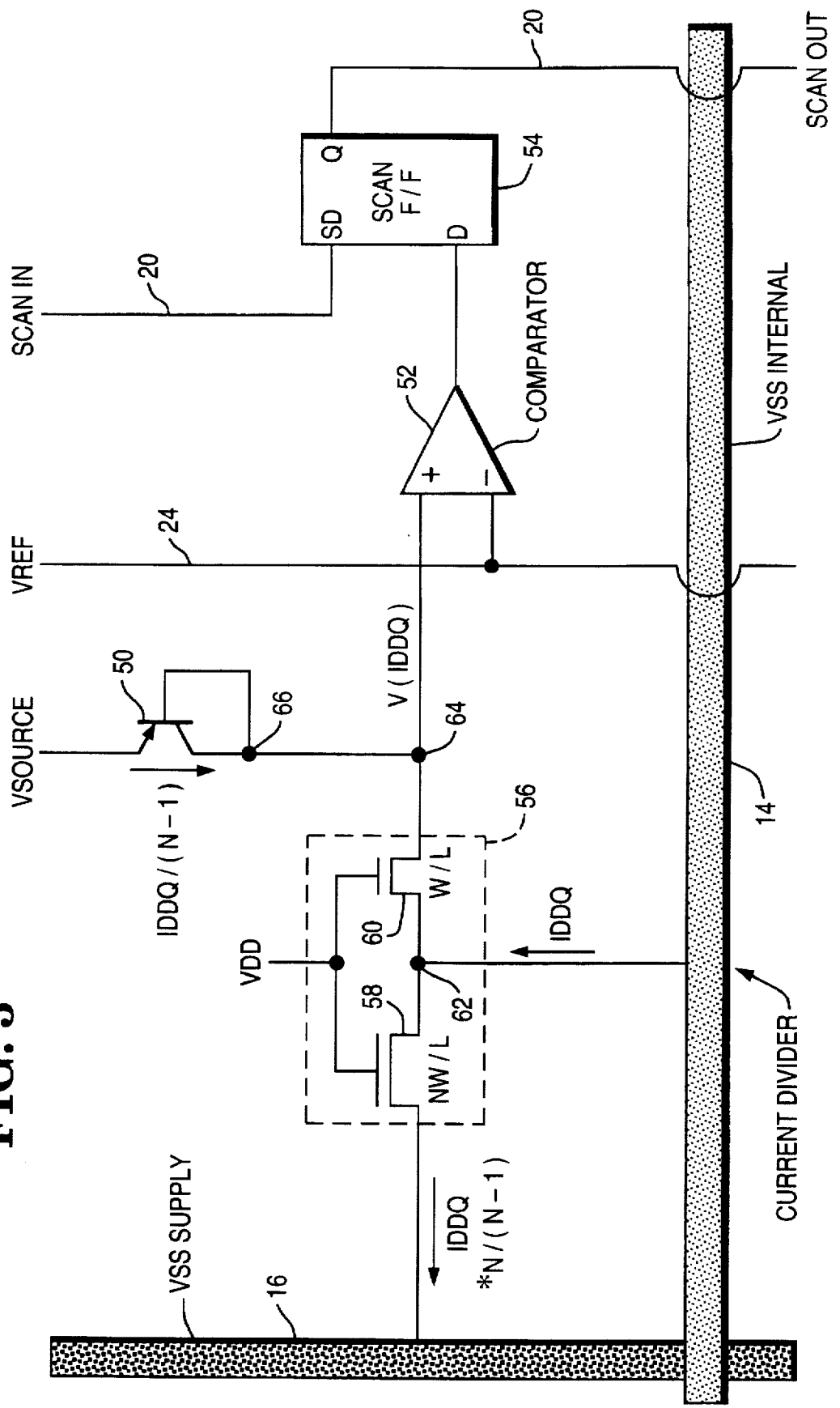
FIG. 3 is a circuit diagram similar to FIG. 2, but showing an Iddq current monitor cell which includes a current divider.

A second implementation of the Iddq current monitor of the present invention is shown in FIG. 3. This implementation is similar to the implementation of FIG. 2, insofar as it includes a current sensor 50, a comparator 52 and a scan flip flop 54. It differs however in also including a current divider 56, comprising two MOS transistors 58 and 60. This circuit minimizes the impact of measuring the current. A voltage VDD is applied to the gate of each of the transistors 58 and 60. The transistor 58 is connected with its source to the VSS supply 16, and the drain is connected to a node 62, which is connected to the internal bus 14. The transistor 60 has its drain connected through a node 64 to the plus terminal of the comparator 52. The output of the comparator 52 is connected to the data input D of the flip flop 54, as in the embodiment of FIG. 2. The emitter of the current sensor 50 is connected to a voltage source VSOURCE, while its collector is connected through a node 66 to the node 64, and its base is also connected to the node 66.

As mentioned above, the two transistors 58, 60 act as a current divider, and are sized relative to each other so that only a relatively small portion of the total current is used for the testing function. This minimizes the effect of conducting the test on the normal continuing operation of the integrated circuit 10. The quantity W/L is a ratio of width to length which relates to the size of the transistor. The relative sizes of the transistors are proportional to the currents drawn by the two transistors. The term N is the ratio of the relative sizes of the two transistors. Thus it will be seen that the size of the transistor 58 is N times the size of the transistor 60, which means that only a small proportion of the total amount of current passes through the transistor 60 and is used in performing the testing function. By virtue of this arrangement, the current through the current sensor is Iddq/(N−1), the voltage drop of the current sensor is V(Iddq) and the current through the transistor 58 is Iddq*N/(N−1).

The operation of the circuit of FIG. 3 is essentially similar to that of FIG. 2, except that only a relatively small proportion of the total current is employed for comparison purposes. That proportion is converted to the V(iddq) voltage level by the current sensor 50, and that voltage level is compared with the VREF voltage level in the comparator 52, with a signal representing the result of the comparison being applied to the scan flip flop 54. The state of the flip flop is scanned during a scan operation via the Scan In and Scan Out conductors, as previously described.

Figure 4:
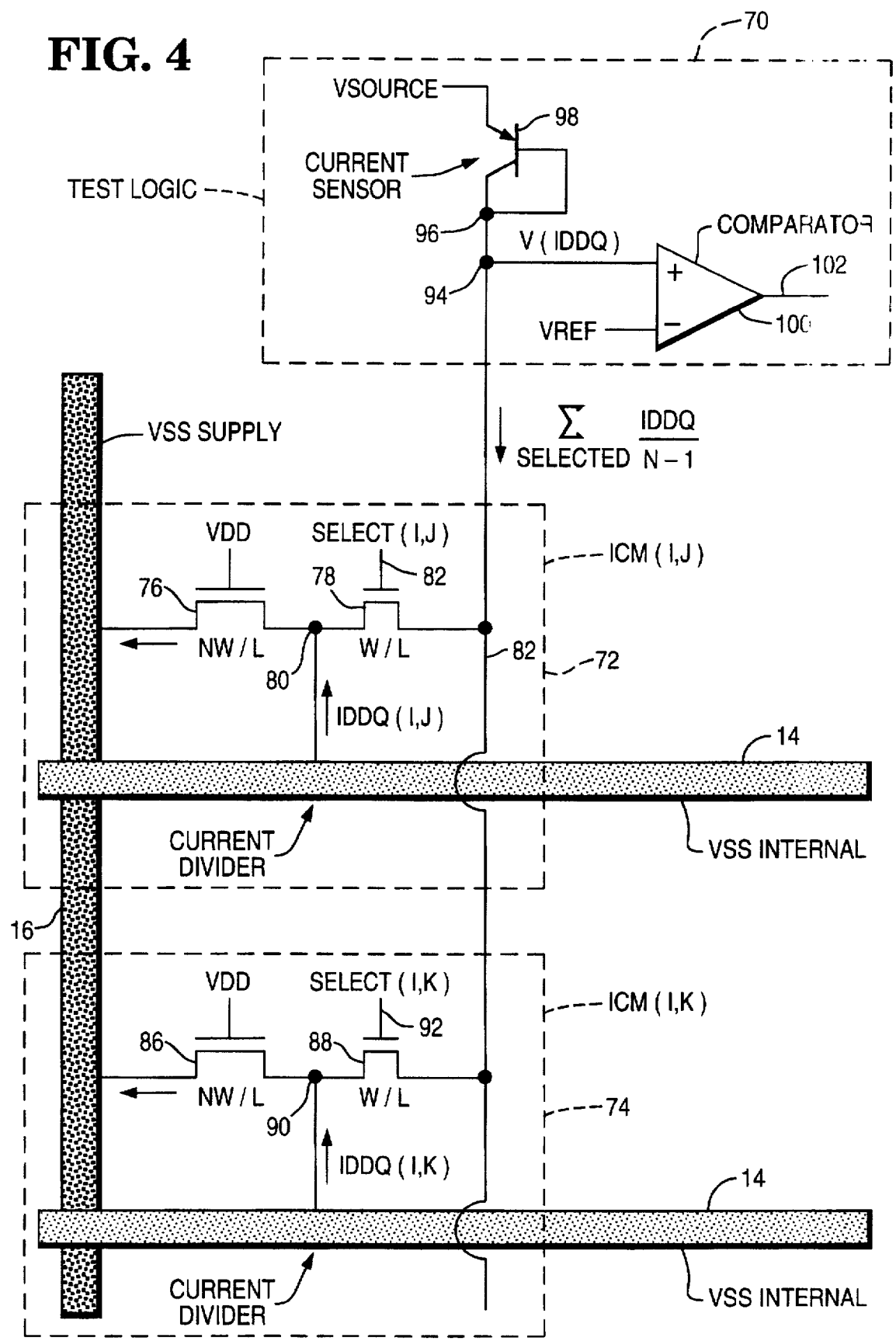
FIG. 4 is a circuit diagram showing a plurality of current monitor cells with common current sensing.

A third implementation of the Iddq current monitor of the present invention is shown in FIG. 4. In this implementation, simplification is achieved by moving the current sensor and the comparator to the test control logic, which will be shared by all the current monitor cells, as represented by the block 70, which may be considered to be included in the test control logic 22 of FIG. 1. FIG. 4 shows two similar iddq current monitor cells 72 and 74 arranged in a single column, but it is contemplated that an integrated circuit could readily contain a plurality of such cells, arranged in a plurality of rows and columns, similar to the arrangement shown in FIG. 1. The cell 72 contains a pair of MOS transistors 76 and 78, similar to the transistors 58 and 60 in the embodiment of FIG. 3. The transistor 76 is connected between the VSS supply 16 and a node 80, while the transistor 78 is connected between the node 80 and a conductor 82. The node 80 is connected to the VSS internal bus 14 which supplies current Iddq(I,j), representing the current in the cell located in column I, row J, to the node 80 and the transistors 76 and 78. The gate of the transistor 76 is connected to a voltage source VDD, while the gate of the transistor 78 is connected to a select line 82 to which a select signal SELECT(I,J) may be applied.

The cell 74 is similarly configured, with a transistor 86 being connected between the VSS supply 16 and a node 90, and a transistor 88 being connected between the node 90 and the conductor 82. The node 90 is connected to the VSS internal bus 14. The gate of the transistor 86 is connected to a voltage source VDD, while the gate of the transistor 88 is connected to a select line 92 to which a select signal SELECT(I,K) may be applied.

The conductor 82 is connected through first and second nodes 94 and 96 to the collector of a current sensor transistor 98 in the test logic block 70. The emitter of said transistor is connected to a source of voltage VSOURCE, and the base is connected to the node 96.

The node 94 which is electrically coupled to the collector of the current sensor transistor 98 is connected to the plus input of a comparator 100, the minus input of which is connected to a reference voltage VREF. The output of the comparator is on a line 102. The current measured by the test logic 70 is the sum of iddq currents divided by (N−1) of all of the selected cells.

Each cell, such as cell 72, can be individually interrogated by applying a suitable select signal such as SELECT(I,J) to the conductor 82 connected to the gate of the transistor 78. As previously described in connection with FIG. 3, the two transistors 76 and 78 act as a voltage divider, so that the integrated circuit which includes the cell 72 can continue its normal operation while testing is being carried on. Application of the signal SELECT(I,J) to the gate of the transistor 78 causes a signal to be applied to the plus input of the comparator 100, resulting in an output signal on the output line 102 having a logic level which is descriptive of whether or not there is a fault in the portion of the integrated circuit being monitored by the cell 72. The output of the comparator 100 can be sampled at times corresponding to the times of application of the various select signals such as SELECT(I, J) in order to determine which, if any, of the cells is indicating the presence of a fault.

Although the invention has been described with particular reference to preferred embodiments thereof, variations and modifications of the present invention can be effected within the spirit and scope of the following claims.

What is claimed is:

1. Apparatus for localized testing for faults in a plurality of logic cells within an integrated circuit, comprising:

current monitoring means connected to said plurality of logic cells for separately monitoring the current in each of said plurality of logic cells wherein fault detection that is localized to each of said plurality of logic cells is provided;

at least a first power supply bus in which said first power supply bus supplies power at least current monitoring means;

at least a first internal power bus electrically connected to said first power supply bus and in which said first power supply bus distributes power to said first internal power bus, with said first internal power bus providing power to at least a first of said plurality of logic cells wherein said power applied to said first of said plurality of logic cells by said first internal power bus is the same power applied to said current monitoring means by said first power supply bus; and a fault monitoring circuit coupled to said current monitoring means for reporting detected faults in said plurality of logic cells.

2. The apparatus of claim 1, wherein:

said integrated circuit includes a plurality of internal power busses including said first internal power bus, said first power supply bus provides power to each of said plurality of internal power busses and each of said plurality of internal power busses provides power to a different one of said plurality of logic cells; and said current monitoring means includes a plurality of current monitoring cells embedded within said integrated circuit, each of which is connected between said first power supply bus and a different one of said plurality of internal power busses for monitoring the current in one of said plurality of logic cells.

3. The apparatus of claim 2, in which each of said plurality of current monitoring cells further monitors the power to one of said plurality of logic cells to perform both power distribution and fault detection functions.

4. The apparatus of claim 3, in which said plurality of current monitoring cells includes current sensing circuitry for performing fault detection.

5. The apparatus of claim 4, in which said current sensing circuitry comprises a transistor.

6. The apparatus of claim 4, in which said plurality of current monitoring cells also include comparison circuitry coupled to said current sensing circuitry for comparing a static power voltage with a reference voltage.

7. The apparatus of claim 6, in which each of said plurality of current monitoring cells also includes a storage device coupled to said comparison circuitry for latching a result of said comparison.

8. The apparatus of claim 4, in which said plurality of current monitoring cells also include bypass circuitry coupled between said first power supply bus and each of said plurality of internal power busses for selectively bypassing at least one of said current sensing circuitry.

9. The apparatus of claim 4, in which said plurality of current monitoring cells also include current divider circuitry coupled to said current sensing circuitry to divide the current drawn by each of said plurality of current monitoring cells into the current to be distributed to said integrated circuit and current to be employed for fault detection.

10. The apparatus of claim 9, in which said current divider circuitry comprises a plurality of interconnected MOS transistors.

11. The apparatus of claim 2 in which said fault monitoring circuit includes a scanning circuit coupled to said plurality of current monitoring cells for sequentially scanning said plurality of current monitoring cells to sequentially test for a fault in each of said plurality of logic cells and, when a fault exists, to determine which one of said plurality of logic cells has the fault.

12. An apparatus for localized testing for faults in a plurality of logic cells within an integrated circuit, comprising:

a single current sensor, coupled to said plurality of logic cells, for sensing a current level in each of said plurality of logic cells;

circuitry for electrically coupling said current sensor to said plurality of logic cells one at a time so that said current sensor selectively senses the current level in each of said plurality of logic cells; and a single comparator, electrically coupled to said current sensor, for comparing the current level sensed by said current sensor with a reference signal to determine whether or not a fault is present.

13. Apparatus for testing for faults in an integrated circuit, said integrated circuit including a plurality of logic cells and a plurality of power busses that provide a first current signal to said logic cells for their operation, comprising:

a plurality of current monitoring cells embedded within said integrated circuit and connected to said power busses, wherein said current monitoring cells include current sensing circuitry and bypass circuitry coupled to said current sensing circuitry for selectively bypassing said current sensing circuitry.

14. The apparatus of claim 13, in which said power busses include power supply busses and internal power busses, at least one of said power busses providing power to a plurality of internal power busses, at least one of said internal power busses providing power to said logic cells, and the current monitoring cells provide interconnections between said power supply busses and said internal power busses.

15. The apparatus of claim 14, in which said current monitoring cells perform both power distribution between the power supply busses and internal power busses and fault detection functions.

16. The apparatus of claim 14, in which said bypass circuitry is coupled between at least one of said power supply busses and at least one of said internal power busses.

17. The apparatus of claim 13, further comprising a scanning circuit coupled to said current monitoring cells for sequentially scanning said current monitoring cells.

18. The apparatus of claim 13, in which said current sensing circuitry comprises a transistor.

19. The apparatus of claim 13, in which said current monitoring cells also include comparison circuitry coupled to said current sensing circuitry for comparing a static power voltage with a reference voltage.

20. The apparatus of claim 19, in which said current monitoring cells also include a storage device coupled to said comparison circuitry for latching the result of a fault test.

21. The apparatus of claim 20, in which said storage device comprises a flip flop.

22. The apparatus of claim 13, in which said first current signal is a static current.

23. Apparatus for testing for faults in an integrated circuit, comprising:

a plurality of current monitoring cells embedded within said integrated circuit, each current monitoring cell comprising a current sensor which is connected between a power supply bus and an internal power bus, said internal power bus providing a first current signal from said power supply bus to a plurality of logic cells in said integrated circuit, said current sensor converting said first current signal to a voltage drop which is a function of said first current signal at the same time that said first current signal is being provided to said logic cells for their operation and wherein said first current signal that is converted is the same as said first current signal that is supplied to said logic cells, a comparator coupled to said current sensor which compares said voltage drop to a reference voltage, and a storage device coupled to said comparator for storing the result of the comparison; and a scan device which is coupled to the storage devices of the current monitoring cells for sequentially scanning said storage devices for ascertaining fault conditions in said logic cells associated with any of said current monitoring cells.

24. The apparatus of claim 23, in which said current sensor is a transistor.

25. The apparatus of claim 23, in which said storage device is a flip flop.

26. Apparatus for testing for faults in an integrated circuit, said integrated circuit including a plurality of logic cells and power busses for providing a first current signal to said logic cells for their operation, comprising:

a plurality of current monitoring cells embedded within said integrated circuit and connected to said power busses, at least one of said current monitoring cells detecting said first current signal in one of said power busses;

a current sensor coupled to a plurality of said current monitoring cells for sensing said first current signal in one of said current monitoring cells at a time;

circuitry for sequentially selecting said current monitoring cells to be operatively coupled to said current sensor independent of the state of said first current signal; and a comparator for comparing a voltage produced by a selected current sensor with a reference voltage independent of the state of said first current signal to determine whether or not a fault is present in any of said logic cells being provided said first current signal for their operation.

27. The apparatus of claim 26, in which said current sensor comprises a transistor.

28. The apparatus of claim 26, in which said power busses include power supply busses and internal power busses, at least one of said power busses providing power to a plurality of internal power busses, at least one of said internal power busses providing power to said logic cells, and the current monitoring cells provide interconnections between said power supply busses and said internal power busses.

29. The apparatus of claim 26, in which said first current signal is a static current.

30. A method for testing logic cells within integrated circuits for faults, comprising the following steps:

(a) embedding a plurality of current monitoring cells in an integrated circuit and connecting said current monitoring cells to a plurality of power busses that supply a first current signal to logic cells for their operation;

(b) asynchronously sensing said first current signal in the power busses independent of the state of said first current signal using current sensing circuitry in said current monitoring cells to determine the presence of a fault;

(c) asynchronously comparing a voltage derived from said first current signal with a reference voltage independent of the state of said first current signal;

(d) storing the result of such comparison; and (e) sequentially scanning said current monitoring cells to ascertain which, if any, current monitoring cells indicate the presence of a fault.

31. The method of claim 30, also including the step of selectively bypassing said current sensing circuitry.

32. The method of claim 30, in which step (d) comprises latching of a flip flop.

33. The method of claim 30, in which step (a) includes said power busses supplying said first current signal as a static current to said logic cells.

* * * * *

UNITED STATES PATENT AND TRADEMARK OFFICE
CERTIFICATE OF CORRECTION

PATENT NO. : 5,726,997
DATED : March 10, 1998
INVENTOR(S) : Andres R. Teene

It is certified that error appears in the above-indentified patent and that said Letters Patent is hereby corrected as shown below:

On the Title Page, after Inventor
        add

Assignees: AT&T Global Information Solutions Company, Dayton, Ohio; Hyundai Electronics America, San Jose, Calif.; Symbios Logic Inc., Fort Collins, Colo.

On the Title Page, after Assistant Examiner
        add

Attorneys, Agent, or Firm: Wayne P. Bailey

Signed and Sealed this

Fifteenth Day of September, 1998

*Attest:*

BRUCE LEHMAN

*Attesting Officer*     *Commissioner of Patents and Trademarks*